(12) United States Patent
Takahashi et al.

(10) Patent No.: US 8,203,311 B2
(45) Date of Patent: Jun. 19, 2012

(54) BATTERY CONDITION DETECTING APPARATUS THAT DETECT CANCELLATION OF A POLARIZATION OF A BATTERY

(75) Inventors: Shin Takahashi, Kariya (JP); Tadatoshi Asada, Anjo (JP)

(73) Assignee: Denso Corporation, Kariya (JP)

( * ) Notice: Subject to any disclaimer, the term of this patent is extended or adjusted under 35 U.S.C. 154(b) by 700 days.

(21) Appl. No.: 11/976,395

(22) Filed: Oct. 24, 2007

(65) Prior Publication Data

US 2008/0094034 A1    Apr. 24, 2008

(30) Foreign Application Priority Data

Oct. 24, 2006 (JP) ................................ 2006-288224

(51) Int. Cl.
*H02J 7/00* (2006.01)
(52) U.S. Cl. .................. 320/134; 320/132; 324/427
(58) Field of Classification Search .................. 320/134
See application file for complete search history.

(56) References Cited

U.S. PATENT DOCUMENTS 6,608,482 B2 *  8/2003  Sakai et al. .................. 324/426
6,624,636 B2    9/2003  Arai et al.

FOREIGN PATENT DOCUMENTS

| DE | 69917036 T2 | 4/2005 |
| DE | 60020821 T2 | 5/2006 |
| DE | 6002004007417 T2 | 3/2008 |
| JP | A-2002-184469 | 6/2002 |
| JP | A-2002-236157 | 8/2002 |
| JP | A-2003-236157 | 8/2003 |

OTHER PUBLICATIONS

Aug. 12, 2001, Office Action issued in German Application No. 10 2007 050 628.9 (with translation).

* cited by examiner

*Primary Examiner* — Arun Williams
(74) *Attorney, Agent, or Firm* — Oliff & Berridge, PLC

(57) ABSTRACT

There is provided a battery condition detecting apparatus which comprises: means for detecting a discharging and charging current from the battery; means for detecting whether or not a negative acceleration of charging current changes in its sign from negative to zero during charging of the battery based on a result of detecting the discharge current; means for calculating an integrated charged capacity of the battery by integrating an instantaneous charging current during charging of the battery; means for controlling an alternator mounted in an automotive vehicle so as to control an output electric power generated by the alternator such that a discharging current from the battery is kept to be constant; and means for determining that the charge polarization is cancelled, if the integrated discharged capacity becomes to be equal to the integrated charged capacity.

6 Claims, 9 Drawing Sheets

COMPARATIVE ART

BATTERY CONDITION DETECTING APPARATUS THAT DETECT CANCELLATION OF A POLARIZATION OF A BATTERY

CROSS REFERENCE TO RELATED APPLICATION

The present application relates to and incorporated by reference Japanese Patent Application 2006-288224 filed on Oct. 24, 2006.

BACKGROUND OF THE INVENTION

1. The Field of the Invention

The present invention relates to a battery condition detecting apparatus that detects cancellation of a polarization of a battery installed on an automotive vehicle or a truck, especially to a battery condition detecting apparatus that detects cancellation of a polarization generated in the battery during charging of the battery.

2. Description of the Prior Art

There is a known prior art of a battery condition detecting apparatus that detects a cancellation of the charge polarization of a battery which is installed on an automotive vehicle or a truck after the battery starts to discharge, wherein the charge polarization is generated in the battery during charging of the battery. For example, such an apparatus is disclosed in Japanese Patent Laid-Open No. 2002-184469. The apparatus described in the Japanese Patent Laid-Open No. 2002-184469, an integrated charged capacity is calculated by integrating an instantaneous charged capacity from a time when charging of the battery starts to a further time when a negative acceleration of charging current changes in its sign from negative to zero. Then, after the battery starts to discharge, if an integrated discharged capacity becomes to be equal to the integrated charged capacity which is estimated just before a start of discharging of the battery, it is determined that the charge polarization generated during charging of the battery is completely canceled.

However, the known prior art of the apparatus described in the Japanese Patent Laid-Open No. 2002-184469, which is used to detect the charge polarization generated during charging of the battery, has the following problems:

(i) the apparatus that is used to detect the charge polarization generated during charging of the battery, is arranged far from a sensor. Further, a battery is located inside the engine compartment of an automotive vehicle. In general, noise such as ignition noise which occurs when the engine is ignited is generated in the engine room, that is, not far from the sensor. This means that the noise is easily superimposed on an electric signal from the sensor so as to make it difficult to accurately detect a time when a negative acceleration of charging current changes in its sign from negative to zero. If a periodic noise such as a periodic ignition noise which is caused periodically at intervals, and the interval of the periodic noise agrees with that of detecting an electric current by a sensor, an offset error is occurred in detecting the electric current. This leads to generate an error in estimating the integrated charged capacity and further to make a wrong judgment about whether or not the charge polarization of the battery is cancelled, (ii) it is necessary to provide the apparatus with an additional electric load in order to keep a constant rate of discharge of the battery. Therefore, the electric load needs an extra space somewhere in the vehicle to be mounted. Further, the electric load consumes electric power unnecessarily, (iii) there are methods for supplying electric power after the electric load is set up, for example. For example, there is a method in which the electric load is composed of a plurality of load elements and the start of supplying electric power to the electric load is delayed until one of the predetermined load elements is activated. Then a method is employed to calculate the integrated charged capacity. There is a further method in which even if the electric load does not reach a steady state thereof because a sufficient time is not elapsed since the electric load was switched on, simply integrating a detected charged capacity is carried out in order to calculate the integrated charged capacity. However, these methods give results in which necessary times for canceling the charge polarization of the battery are scattered and changes of degrees of cancellation of the charge polarization of the battery in time are also scattered. Therefore, it is hard to accurately detect the cancellation of the charge polarization of the battery.

SUMMARY OF THE INVENTION

It is therefore an object of the present invention to provide an improved apparatus that detects the condition of a battery.

According to one aspect of the present invention, there is provided a battery condition detecting apparatus which detects a cancellation of a charge polarization of the battery accurately.

According to another aspect of the present invention, there is provided a battery condition detecting apparatus that does not need any redundant electric load so as to prevent to keep an unnecessary space in a vehicle, especially in an engine room.

According to a further aspect of the present invention, there is provided a battery condition detecting apparatus that does not consume any unnecessary electric power.

According to a further aspect of the present invention, there is provided a battery condition detecting apparatus which comprises: means for detecting a discharging and charging current from the battery; means for detecting whether or not a negative acceleration of charging current changes in sign from a negative value to zero during charging of the battery based on a result of detecting discharge current; means for calculating an integrated charged capacity of the battery by integrating a charging current until when the negative acceleration of the charging current changes in its sign from the negative value to zero during charging of the battery; means for controlling the alternator mounted so as to control an output electric power generated by the alternator such that a discharging current from the battery is kept to be constant in time; and means for determining that the charge polarization of the battery generated during charging of the battery is cancelled, when the integrated discharged capacity comes to be equal to the integrated charged capacity estimated just before a start of discharging of the battery. Since the alternator mounted in the vehicle is controlled so as to supply a constant electric current, which is a necessary condition in order to cancel the charge polarization of the battery, it does not need to provide the apparatus with any additional electric load. Therefore, it does not need any redundant electric load or take up unnecessary space in a vehicle, especially in an engine compartment. Further, it does not need to consume any additional electric power.

According to a further aspect of the present invention, it is preferable that the battery condition detecting apparatus further comprises: a means for controlling the alternator so as to set a terminal voltage of the battery to be a target value. This is realized by controlling an alternator mounted in an automotive vehicle such that the target value of the terminal voltage of the battery is increased or decreased based on a result of a comparison between a detected discharging current detected by the means for detecting a discharging current from the battery and the target value. In many automotive vehicles widely used nowadays, an output electric power generated by the alternator mounted in the automotive vehicle is controlled such that the terminal voltage of the alternator agrees with an inputted target value. Thus, only minimum modifications of the alternator and peripheral devices of the alternator are needed in the case where a target output voltage is constant and a discharging current is variable.

Furthermore, it is preferable that the means for controlling the alternator further comprise: means for calculating an output electric current of the alternator mounted in the automotive vehicle; and means for controlling the output electric current of the alternator mounted in the automotive vehicle based on a calculated result of the output electric current of the alternator such that the output electric current agrees with a target value of discharging current. In this apparatus, it is possible to adjust the output electric current of the battery to the target value of the discharging current rapidly.

Further, it is preferable that the apparatus according to the present invention further comprises: means for detecting the output electric current of the alternator mounted in the automotive vehicle, wherein the means for controlling the output electric current of the alternator mounted in the automotive vehicle corrects the output electric current of the alternator based on the detected result of the output electric current detected by the means for detecting the output electric current of the alternator. Hence, it is possible to improve a stability of operation in which the output electric current of the alternator is corrected so as to keep the discharging current from the battery to be constant.

According to a further aspect of the present invention, there is provided the battery condition detecting apparatus, wherein the method for detecting whether or not the negative acceleration of charging current changes in its sign from negative to zero, the means for calculating the integrated charged capacity of the battery, the means for controlling the alternator, the means for determining whether or not the charge polarization of the battery generated during charging of the battery is cancelled, and the means for detecting the discharging and charging current from the battery are all located near terminals of the battery. For example, the means for detecting the discharging and charging current from the battery is an electric current sensor fixed to the terminals of the battery or installed in the housing of the battery. It is preferable that the electric current sensor includes the method for detecting whether or not the negative acceleration of charging current changes in its sign from negative to zero, the means for calculating the integrated charged capacity of the battery, the means for controlling the alternator, and the means for determining that the charge polarization of the battery generated during charging of the battery is cancelled. In the case where the battery condition detecting apparatus is located near to the battery as mentioned above, it is possible to prevent noise generated by other apparatuses from being superimposed on the current measured by the electric current sensor. Therefore, an accuracy of detecting the cancellation of the charge polarization of the battery is improved due to reduction of errors in detecting the electric current by the electric current sensor.

DETAILED DESCRIPTION OF PREFERRED EMBODIMENTS

Referring to the accompanied drawings, a battery condition detecting apparatus for detecting cancellation of the charge polarization of a battery, which is in accordance with the present invention, will now be discussed.

Figure 1:
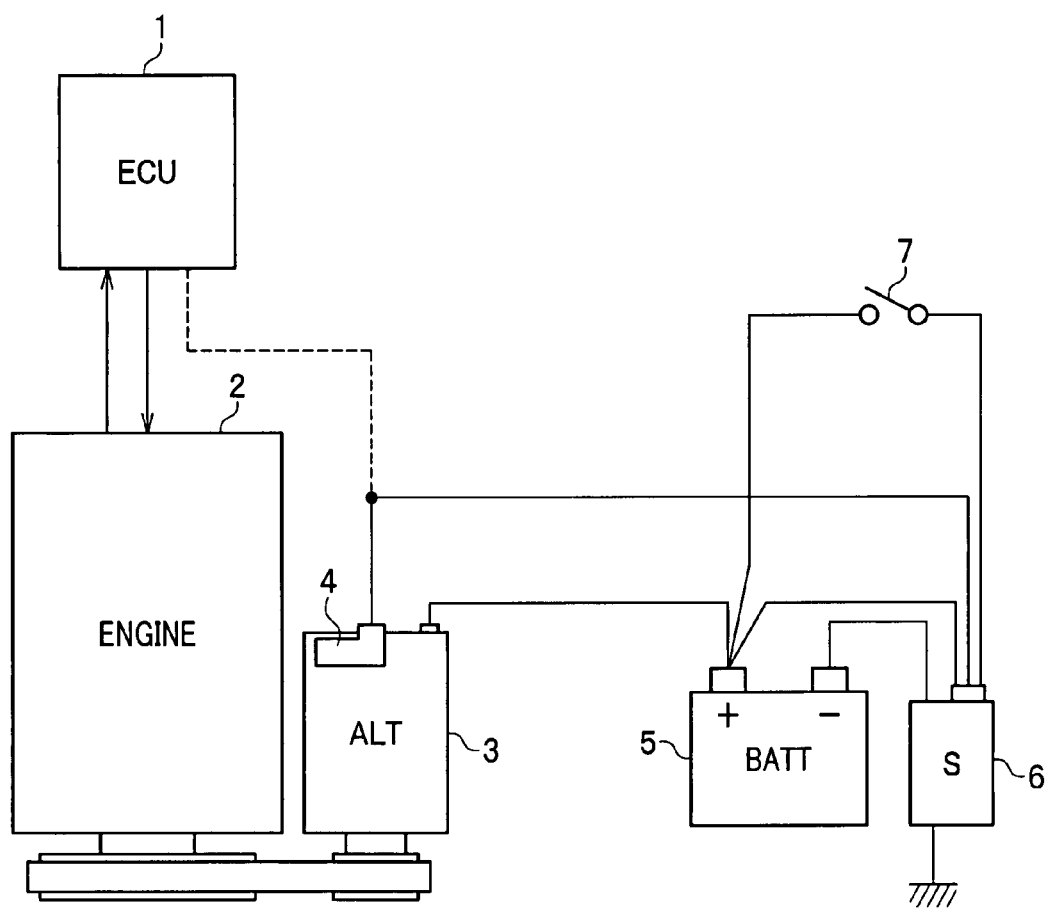
FIG. 1 is a block diagram showing a whole system for charging a battery, which system includes a battery condition detecting apparatus of an example according to the present invention.

FIG. 1 is a block diagram of a whole system for charging a battery including a battery condition detecting apparatus according to the present invention.

The system for charging of the battery shown in FIG. 1 includes an engine control unit (ECU) 1, an engine of an automotive vehicle (hereinafter, it will referred to as "engine") 2, an alternator for use in the automotive vehicle (hereinafter, it will referred to as "alternator") 3, a battery 5, a battery condition detecting apparatus 6, and key switch 7.

The ECU 1 is an external control unit that monitors a rotation condition of rotation of the engine 2 such as a rotation speed of the engine 2 and control the rotation condition of the engine 2. The alternator 3 is driven by the engine 2 via a belt that transfers a rotation of the engine to the alternator, generates electric power by converting a rotation energy transferred from the engine 2 to an electric energy, and supply the electric power to the battery 5 as a charging electric power and other electric loads which are not shown in FIG. 1. In this alternator 3, an electric power generation control unit 4 is mounted for controlling an output voltage of the alternator 3 by adjusting an excitation current of the alternator 3. The battery condition detecting apparatus 6 is located near the battery 5. Further, the battery condition detecting apparatus 6 judges whether or not the charge polarization of the battery 5 generated during charging of the battery is cancelled, and controls the alternator 3 to adjust the electric power generated thereby. For example, the battery condition detecting apparatus 6 is fixed to the terminals of the battery or is installed in the housing of the battery.

Figure 2:
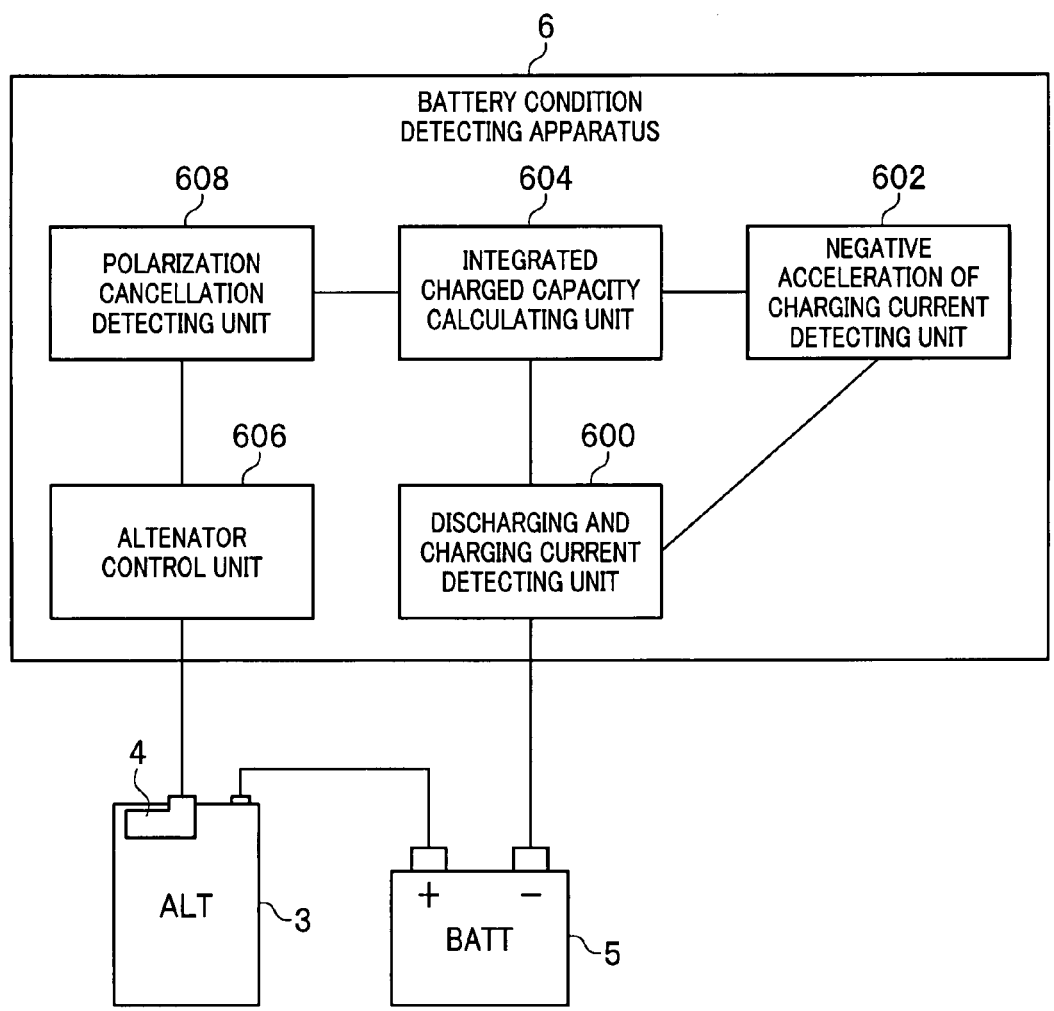
FIG. 2 is a block diagram showing the battery condition detecting apparatus.

FIG. 2 is a detailed block diagram of the battery condition detecting apparatus 6. As shown in FIG. 2, the battery condition detecting apparatus 6 according to the present invention includes a discharging and charging current detecting unit 600, a negative acceleration of charging current detecting unit 602, an integrated charged capacity calculating unit 604, an alternator control unit 606, and a polarization cancellation determining unit 608. The discharging and charging current detecting unit 600 corresponds to means for detecting a discharging and charging current from the battery. The negative acceleration of charging current detecting unit 602 corresponds to means for detecting whether or not a negative acceleration of charging current changes in its sign from negative to zero. The integrated charged capacity calculating unit 604 corresponds to means for calculating an integrated charged capacity of the battery. The alternator control unit 606 corresponds to means for controlling an alternator mounted in an automotive vehicle. The polarization cancellation determining unit 608 corresponds to means for determining that the charge polarization of the battery generated during charging of the battery is cancelled.

The discharging and charging current detecting unit 600 detects a discharging and charging current from the battery.

The negative acceleration of charging current detecting unit 602 determines whether or not a negative acceleration of charging current changes in its sign from negative to zero during charging of the battery based on a result of detecting the discharge current.

The integrated charged capacity calculating unit 604 calculates an integrated charged capacity of the battery by integrating an instantaneous charging current until when the negative acceleration of the charging current changes in its sign from negative to zero during charging of the battery.

The alternator control unit 606 controls an alternator 3 mounted in an automotive vehicle so as to control an output electric power generated by the alternator such that a discharging current from the battery is kept to be constant in time.

The polarization cancellation determining unit 608 determines whether or not the charge polarization of the battery generated during charging of the battery is cancelled, if the integrated discharged capacity becomes to be equal to the integrated charged capacity which is estimated just before a start of discharging of the battery.

Therefore, it can be understood that the battery condition detecting apparatus 6 according to the present invention has not only a function of a conventional electric current sensor which role is played by the discharging and charging current detecting unit 600, but also additional functions that include the negative acceleration of charging current detecting unit 602, the integrated charged capacity calculating unit 604, the alternator control unit 606, and the polarization cancellation determining unit 608.

A simple description of the criterion on which determines whether or not the charge polarization is cancelled will now be given based on the Japanese Patent Laid-Open Publication No. 2002-184469 in which the Japanese Patent Laid-Open Publication No. 2002-236157 is incorporated.

First, a general characteristic of the battery will be reviewed.

Figure 3:
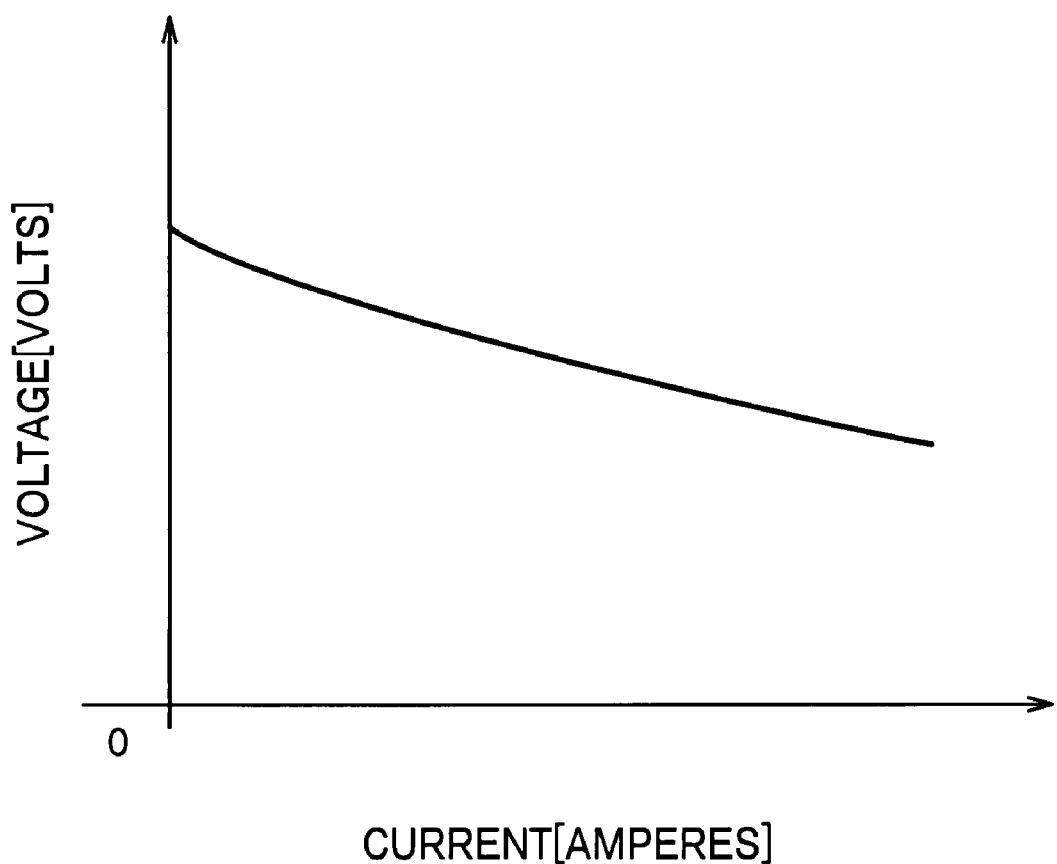
FIG. 3 is a graph showing an example of a voltage-current characteristic.

An automotive vehicle includes an electric load which requires a large amount of current in, for example, a starter motor, a motor generator, and a running motor if the automotive vehicle is driven by an electric motor. An example of the voltage-current characteristic of such a battery is shown in FIG. 3. FIG. 3 is a graph showing an example of the voltage-current characteristic of a battery mounted on an automotive vehicle. FIG. 3 is different from FIG. 10 in the range of the current, that is, the voltage-current characteristic in FIG. 3 covers only a part of that in FIG. 10 because a higher current region where a strong nonlinearity of the voltage-current characteristic is observed is not accessed in practice.

Figure 10:
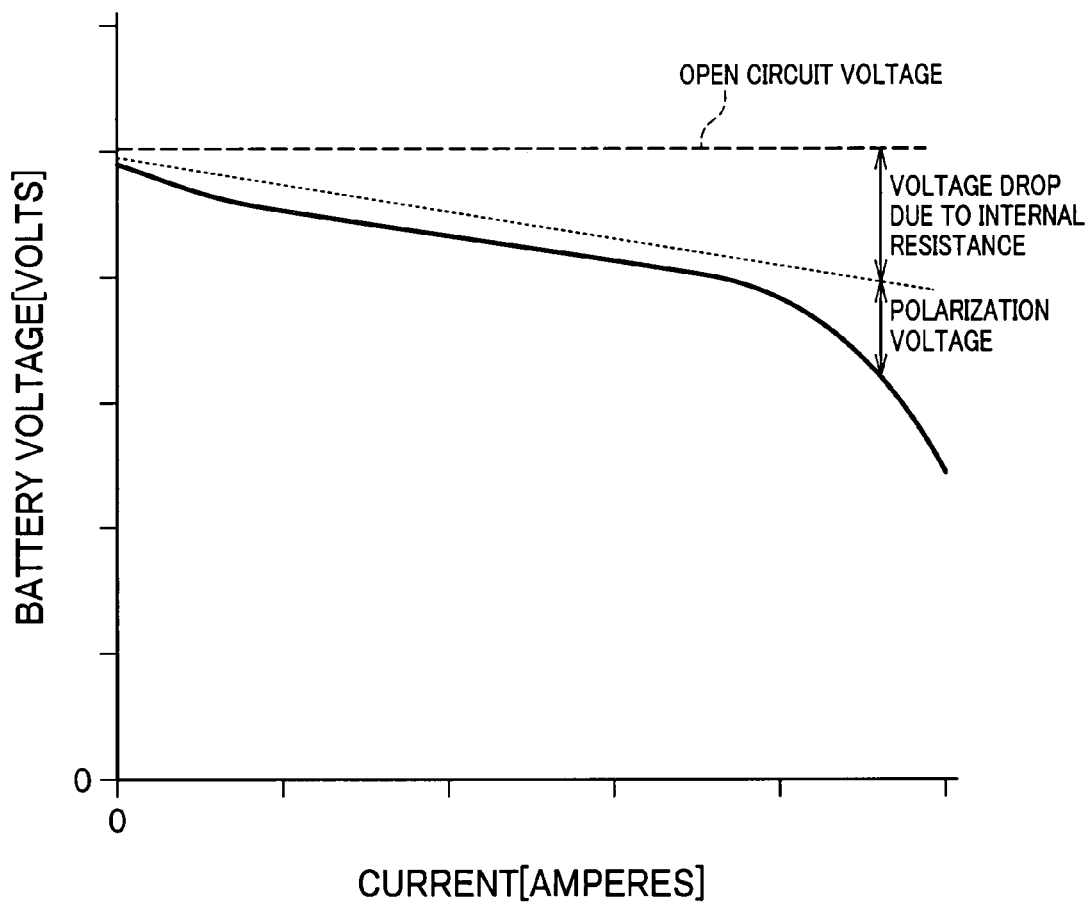
FIG. 10 is a graph showing a relationship between voltage of the battery and current density.

As shown in FIG. 3, the voltage-current characteristic can be approximated by a linear relation between the voltage and the current of the battery. However, as shown in FIG. 10, effects of the charge polarization and the discharge polarization give nonlinearity to the voltage-current characteristic of the battery.

Then, the theoretical background of the operations that carried out by the battery condition detecting apparatus 6 will now be explained.

Figure 9:
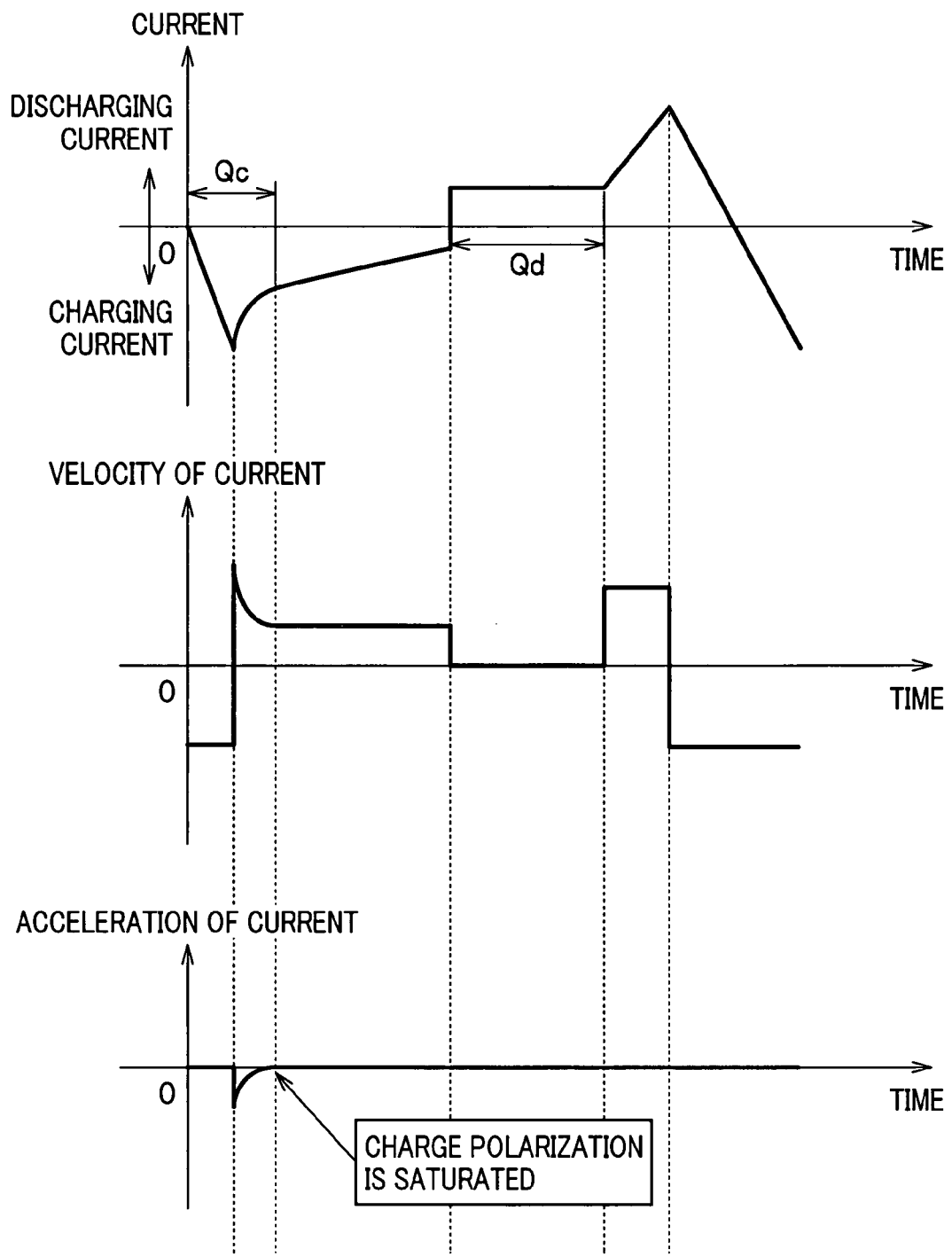
FIG. 9 is a graph showing a charging and discharging current varying with time, a velocity of the charging and discharging current varying with time, and an acceleration of the charging and discharging current varying with time in which a cancellation of the charge polarization can be seen at a point where a negative acceleration of charging current changes in its sign from negative to zero.

FIG. 9 is a graph showing a charging and discharging current that varies over time, a change velocity of the charging and discharging current over time, and an acceleration of the charging and discharging current that varies over time. The change velocity of the charging and discharging current is obtained by differentiating the charging and discharging current with time. The acceleration of the charging and discharging current is obtained by further differentiating the velocity of the charging and discharging current with time. As shown in FIG. 9, the charging current increase just after the charging action has been started. As the charging current increases after the charging is started, the polarization voltage increases gradually. When the current reaches its maximum value thereof, the polarization voltage has a maximum value as shown in FIG. 10. However, since the chemical reaction occurred in the battery is delayed with respect to change in the current of the battery, an increase in the polarization is actually not stopped. Thereafter, the increase of the polarization is dissolved with a decrease in the current. If the polarization is completely dissolved, a linear relation between the voltage and the current should be observed. Therefore, it is recognized that the polarization is saturated when an acceleration of the charging current becomes to 0. The integrated charged capacity Qc is calculated by integrating the charged capacity from a time instant when the charging is started to a further time instant when the acceleration of the charging current becomes to 0. This integrated charged capacity Qc is accompanied with the polarization of the battery. In order to cancel the polarization of the battery, the same amount of integrated charged capacity Qc should be discharged. Thus, the polarization cancellation determining unit 608 determines that the polarization is completely cancelled when the integrated discharged capacity Qd becomes equal to the charged capacity Qc.

As discussed above, the battery condition detecting apparatus according to the present invention consists of several units. Referring to FIGS. 4-7, an operation of the battery condition detecting apparatus 6 will be described.

Figure 4:
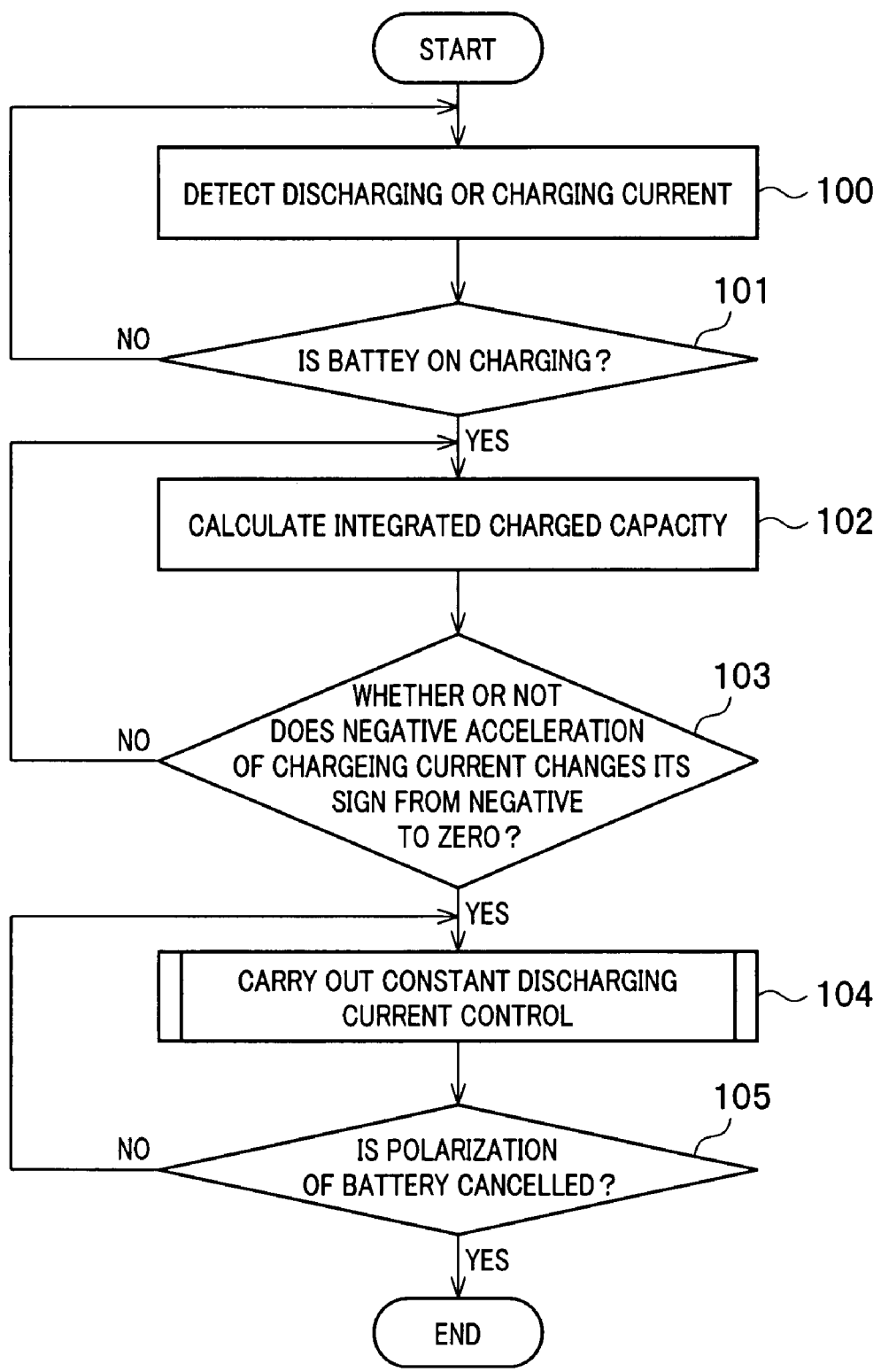
FIG. 4 is a flow chart illustrating an operating process of detecting a cancellation of a charge polarization of the battery.

FIG. 4 is a flow chart illustrating an operating process of detecting a cancellation of a charge polarization of the battery.

At Step 100, the discharging and charging current detecting unit 600 detects the discharging or charging current of the battery 5.

Then, at Step 101, the integrated charged capacity calculating unit 604 determines whether or not the battery 5 is in a charging state based on a result of detecting the discharging or charging current at Step 100. If the battery 5 is not in the charging state, a result of the determination at Step 101 is "NO", and the processing returns to Step 100 at which the discharging and charging current detecting unit 600 repeatedly detects the discharging or charging current of the battery 5. If the battery 5 is in the charging state, a result of the determination at Step 101 is "YES". In this case, the processing proceed to Step 102, and at Step 102 the integrated charged capacity calculating unit 604 integrates an instantaneous charging current detected by the discharging and charging current detecting unit 600 so as to obtain the integrated charged capacity of the battery 5.

Further, at Step 103, the negative acceleration of charging current detecting unit 602 determines whether or not the negative acceleration of the charging current changes in its sign from negative to zero during charging of the battery 5. If the sign of negative acceleration of the charging current is not changed, a result of the determination at Step 103 is "NO", and then the processing returns to Step 102 at which a calculation of the integrated charged capacity of the battery 5 and the subsequent processing are carried out repeatedly. If the sign of negative acceleration of the charging current is changed, a result of the determination at Step 103 is "YES". In this case, the alternator control unit 606 sends a control signal to the electric power generation control unit 4 installed in the alternator 3 so that an output electric power from the alternator 3 is adjusted so as to maintain the discharge current from the battery 5 to be constant at Step 104. This control of the discharge current by the electric power generation control unit 4 is hereinafter referred to as "constant discharge current control".

Further, at Step 105, the polarization cancellation determining unit 608 determines whether or not the integrated discharged capacity of the battery 5 becomes to be equal to the integrated charged capacity which is estimated just before a start of discharging of the battery 5, and judges whether or not the charge polarization of the battery 5 is cancelled based on the result of the determination just mentioned. If the integrated discharged capacity of the battery 5 does not reach the integrated charged capacity, it is determined that the charge polarization of the battery 5 has not been cancelled yet. In this case, a result of the determination at Step 105 is "NO", and the processing returns to Step 104 at which the constant discharge current control is continued to be carried out. If the integrated discharged capacity of the battery 5 becomes to be equal to the integrated charged capacity, it is determined that the charge polarization of the battery 5 is cancelled. In this case, a result of the determination at Step 105 is "YES", and the sequential steps of detecting the polarization cancellation of the battery 5 are completed.

Figure 5:
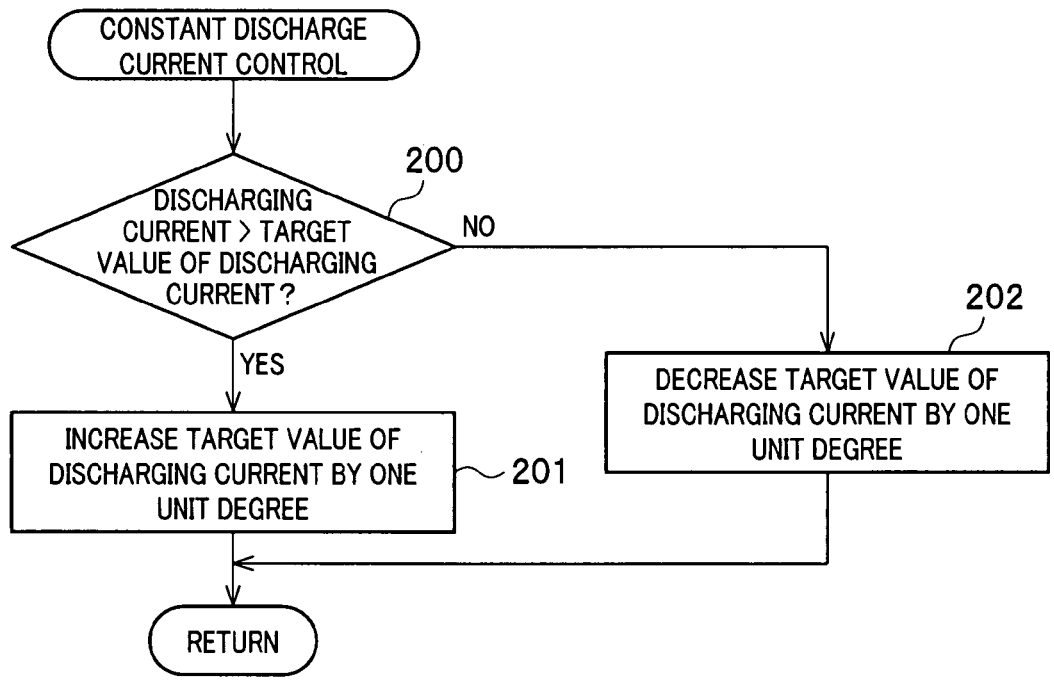
FIG. 5 is a flow chart of a subroutine illustrating an operating procedure executed in Step 104 shown in FIG. 3, in which discharging current is kept constant by controlling an output voltage of an alternator.

FIG. 5 is a flow chart of a subroutine illustrating an operating procedure executed in Step 104 shown in FIG. 4, in which discharging current is kept constant by controlling an output voltage of the alternator 3.

At Step 200, the alternator control unit 606 determines whether or not the discharging current detected by the discharging and charging current detecting unit 600 is greater than a target value of the discharging current (that is, the discharging current>a target value of the discharging current).

If the actual discharging current detected by the discharging and charging current detecting unit 600 is greater than the target value of the discharging current, a result of the determination at Step 200 is "YES". In this case, the processing proceeds to Step 201 at which the alternator control unit 606 increases the target value of the discharging current by one unit degree of an output voltage of the alternator 3. The unit degree of the output voltage of the alternator 3 is predetermined and is used to increase or decrease the target value of the output voltage of the alternator 3 which is controlled by the electric power generation control unit 4. If the target value of the output voltage of the alternator 3 is increased, the output voltage of the alternator 3 is increased. An increment of the output voltage of the alternator 3 leads to reduce the discharge current of the battery 5 and consequently to adjust the discharge current of the battery 5 to the target value of the discharging current.

In contrast to this, if the actual discharging current detected by the discharging and charging current detecting unit 600 is not greater than the target value of the discharging current, a result of the determination at Step 200 is "NO". In this case, the processing proceeds to Step 202 at which the alternator control unit 606 decreases the target value of the discharging current by one unit degree of an output voltage of the alternator 3. If the target value of the output voltage of the alternator 3 is decreased, the output voltage of the alternator 3 is also decreased. A decrement of the output voltage of the alternator 3 leads to raise the discharge of the battery 5 and consequently to adjust the discharge of the battery 5 to the target value of the discharging current.

It is preferable that, in contrast to the above mentioned control under which the target value of the output voltage of the alternator 3 is increased or decreased by one unit degree of an output voltage of the alternator 3 based on a comparison result of whether or not the actual discharging current detected by the discharging and charging current detecting unit 600 is not greater than the target value of the discharging current, the target value of the output voltage of the alternator 3 is set under a so-called proportional-integral-derivative (PID) control.

Figure 7:
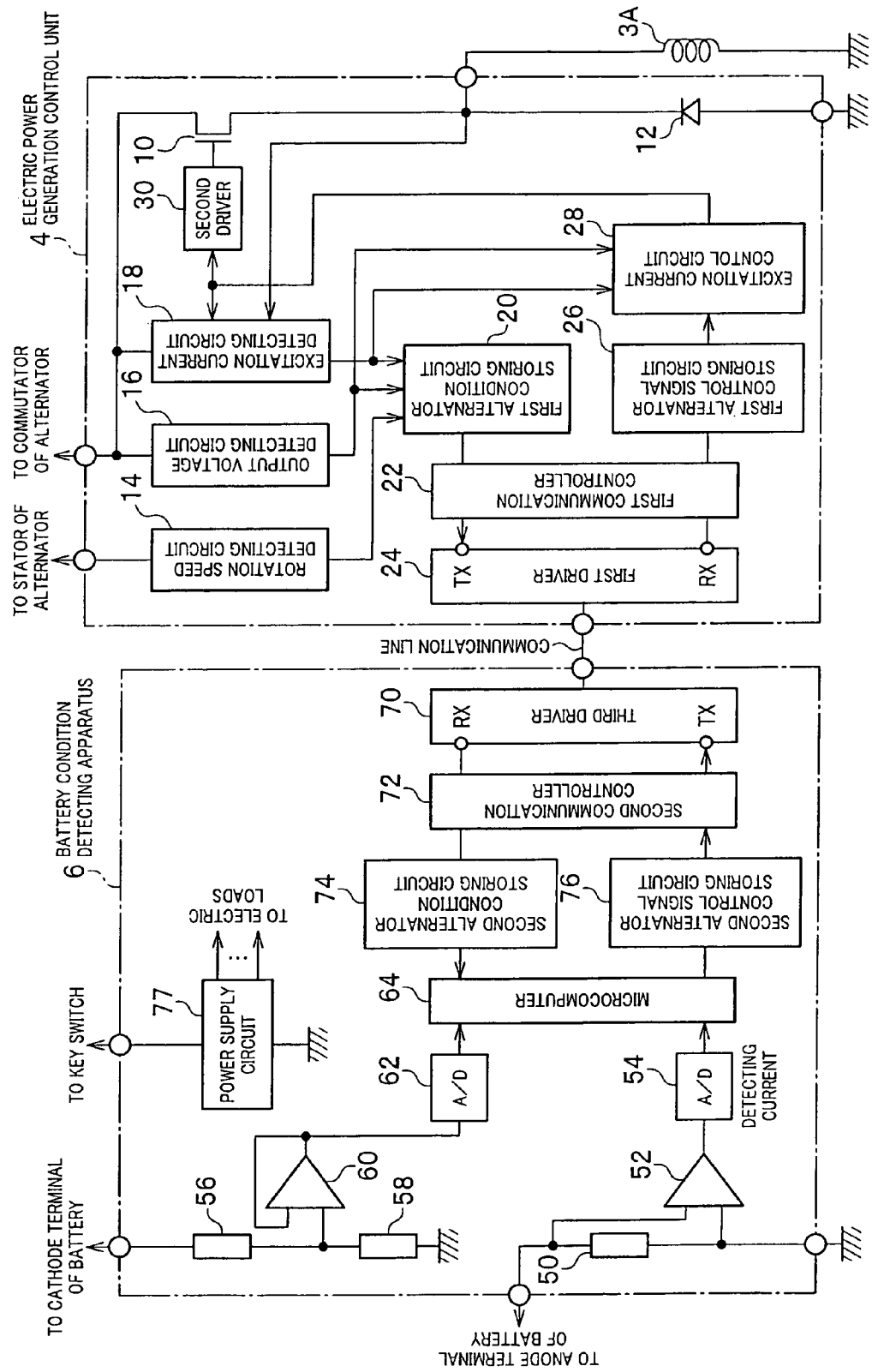
FIG. 7 is a block diagram of both the battery condition detecting apparatus and an electric power generation control unit 4.

FIG. 7 is a flow chart of a subroutine illustrating an operating procedure executed in Step 104 shown in FIG. 4, in which discharging current is kept constant by controlling an output electric current of the alternator 3.

At Step 210, the alternator control unit 606 calculates an output current of the alternator 3 based on necessary information such as an excitation current of the alternator 3 obtained by the electric power generation control unit 4.

Then, at Step 211, the alternator control unit 606 calculates a target value of the output current of the alternator 3. The target value of the output current of the alternator 3 is obtained by adding a difference between an actual discharging current of the battery 5 detected by the discharging and charging current detecting unit 600 and the target value to the calculated target value of the output current of the alternator 3 according to the following equation:

(the target value of the output current of the alternator 3)=(the calculated target value of the output current)+(the target value of the output current−the actual discharging current of the battery 5).

At Step 212, in order to realize the calculated target value of the output current of the alternator 3, the target value of the output current of the alternator 3 or its alternative which indirectly lead to realize the calculated target value of the output current of the alternator 3 is sent to the electric power generation control unit 4. The alternative to the calculated target value of the output current of the alternator 3 is exemplified by a target value of an excitation current of the alternator 3 which results in the target value of the output current of the alternator 3.

As a result of this, the electric power generation control unit 4 controls the alternator 4 so as to output the target value of the output current.

Referring to FIG. 7, a concrete configuration that carries out the constant discharge current control shown in FIGS. 5 and 6 will be described.

FIG. 7 is a block diagram of both the battery condition detecting apparatus 6 and the electric power generation control unit 4.

As shown in FIG. 7, the electric power generation control unit 4 includes a power transistor 10, a free wheeling diode 12, a rotation speed detecting circuit 14, an output voltage detecting circuit 16, an excitation current detecting circuit 18, a first alternator condition storing circuit 20, a first communication controller 22, a first driver 24, an first alternator control signal storing circuit 26, an excitation current control circuit 28, and a second driver 30.

The power transistor 10 connects serially to excitation windings 3A of the alternator 3. If the power transistor 10 is switched on, the excitation windings 3A receive an excitation current thereof.

The free wheeling diode 12 connects serially to the excitation windings 3A of the alternator 3. If the power transistor 10 is switched off, the excitation current flowing through the excitation windings 3A flows back.

The rotation speed detecting circuit 14 detects the rotation speed of the alternator 3. For example, the rotation speed detecting circuit 14 detects the rotation speed of the alternator 3 by monitoring a phase frequency which appeared in phase windings of starter windings of the alternator 3.

The output voltage detecting circuit 16 detects an output voltage of the alternator 3.

The excitation current detecting circuit 18 detects an excitation current flowing through the excitation windings 3A of the alternator 3. For example, the excitation current detecting circuit 18 obtains operating conditions of the power transistor 10. One of the operating conditions is either in a switched-on state or a switched-off state. Both of this operating condition of the power transistor 10 and the output voltage of the alternator 3 influence a result of calculation of the excitation current of the alternator 3. It is also possible to detect the excitation current of the alternator 3 by inserting a shunt resistor serially to the power transistor 10 and measuring a voltage across the shunt resistor to obtain the excitation current of the alternator 3.

The first alternator condition storing circuit 20 stores an alternator condition signal containing information about the rotation speed of the alternator 3 detected by the rotation speed detecting circuit 14, the output voltage of the alternator 3 detected by the output voltage detecting circuit 16, and the excitation current of the alternator 3 detected by the excitation current detecting circuit 18.

The communication controller 22 converts the alternator condition signal to digital data in a predetermined format for digital communications and carries out a digital modulation processing in which the digital data is modulated for transmissions. The modulated digital signal (digital modulation signal) is sent to the battery condition detecting apparatus 6 via the first driver 24 and a communication line.

The first driver 24 mentioned above further has a function of a receiver that receives a digital modulation signal sent by the battery condition detecting apparatus 6 via the communication line.

Further, the first communication controller 22 has a function of a demodulator that converts the digital modulation signal received by the first driver 24 to the alternator condition signal. The alternator condition signal is temporarily stored in the first alternator control signal storing circuit 26.

The excitation current control circuit 28 controls the alternator 3 such that the output voltage of the alternator 3 coincides with the target value of the output voltage or the excitation current coincides with a predetermined target value of the excitation current by sending a control signal to the second driver 30.

The second driver 30 drives the power transistor 10 according to the control signal sent by the excitation current control circuit 28.

As shown in FIG. 7, the battery condition detecting apparatus 6 includes a shunt resistor 50, amplifiers 52 and 60, analogue-digital (A/D) converters 54 and 62, resistors 56 and 58, a microcomputer 64, a third driver 70, a second communication controller 72, a second alternator condition storing circuit 74, a second alternator control signal storing circuit 76, and a power supply circuit 77.

The power supply circuit 77 starts its operation when the key switch 7 turns to a switched-on state, and supplies electric power to all circuits so as to carry out its own operation of every circuit.

The shunt resistor 50 is used to detect the charging and discharging current of the battery 5. The shunt resistor 50 has two terminals, and one terminal of the shunt resistor 50 connects to an anode terminal of the battery 5 and another terminal connects to a ground.

The amplifier 52 is, for example, a difference amplifier that amplifies a terminal voltage across the shunt resistor 50. This amplified voltage by the amplifier 60 is converted to digital data by the A/D converter 54. The digital data are inputted into the microcomputer 64. The shunt resistor 50, the amplifier 52, and the A/D converter 54 constitutes the discharging and charging current detecting unit 600 shown in FIG. 2.

The resistors 56 and 58 constitute a potential dividing circuit which is used to detect the terminal voltage across the battery 5 (hereinafter sometimes referred as to a "battery voltage"). The potential dividing circuit has two terminals, and one of the terminals connects to a cathode terminal of the battery 5 and another one connects to the ground.

The amplifier 60 is, for example, an operational amplifier (OP amp.) and plays a role of a buffer which connects to an output terminal of the potential dividing circuit consisted by the resistors 56 and 58. An output voltage of the amplifier 60 is converted to digital data by the A/D converter 62. The digital data are inputted into the microcomputer 64. The output voltage of the amplifier 60 is equal to a dividing potential at a connecting point between the resistors 56 and 58 in the battery condition detecting apparatus 6 shown in FIG. 8.

The third driver 70 and the second communication controller 72 are used to transmit electric signals to the electric power generation control unit 4 via the communication line, and to receive electric signals from the electric power generation control unit 4. That is, the third driver 70 and the second communication controller 72 play basically the same rule of the first driver 24 and the first communication controller 22, respectively.

When the digital modulation signal (the alternator condition signal) sent by the electric power generation control unit 4 is received by the third driver 70 via the communication line, the second communication controller 72 demodulates the digital modulation signal and outputs an alternator condition signal. The alternator condition signal generated by the second communication controller 72 stores temporally in the second alternator condition storing circuit 74. When the alternator control signal sent by the microcomputer 64 is inputted into the second alternator control signal storing circuit 76, the second communication controller 72 converts the alternator control signal to digital data in a predetermined format and modulates the digital data and carries out a digital modulation processing in which the digital data is modulated for transmissions. The modulated digital signal (digital modulation signal) is sent to the battery condition detecting apparatus 6 from the third driver 70 via the first driver 24 and a communication line.

The microcomputer 64 functions as the negative acceleration charging current detecting unit 602, the integrated charged capacity calculating unit 604, the alternator control unit 606, and the polarization cancellation determining unit 608 as shown in FIG. 2.

When the electric power generation control unit 4 and the battery condition detecting apparatus 6 are used to control the alternator 3 so as to keep the discharging current from the battery 5 to be constant by adjusting the output voltage of the alternator 3, the operation process shown in FIG. 5 will be described.

Figure 6:
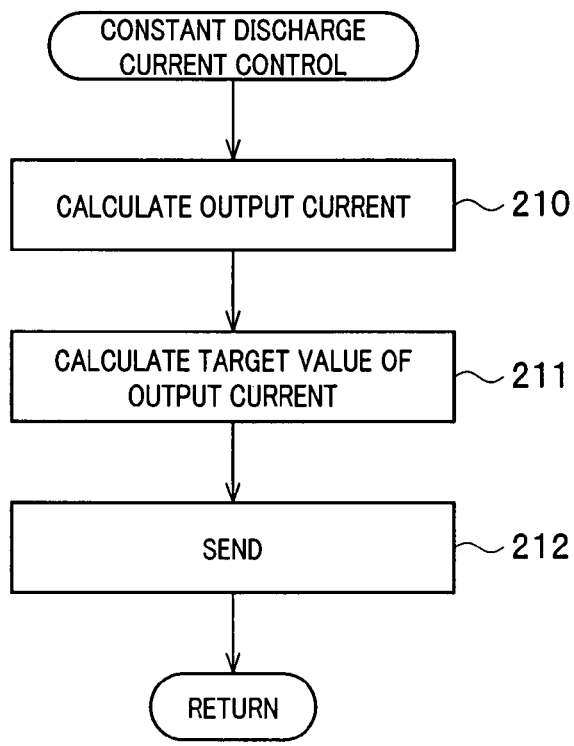
FIG. 6 is a flow chart of a subroutine illustrating an operating procedure executed in Step 104 shown in FIG. 3, in which discharging current is kept constant by controlling an output electric current of the alternator.

When the discharging current of the battery 5 is detected by the shunt resistor 50, the amplifier 52, and the A/D converter 54, the microcomputer 64 compares the detected charging current and a target value of the discharging current as Step 200 in FIG. 6. The microcomputer 64 sends the alternator control signal toward the second alternator control signal storing circuit 76 wherein the alternator control signal contains information which commands the alternator 3 to increase or decrease the target output voltage by one unit degree of the output voltage based on a result of the comparison. This alternator control signal is modulated by the second communication controller 72 and outputted from the third driver 70 to the electric power generation control unit 4. The excitation current control circuit 28 in the electric power generation control unit 4 sets a new target value of the output voltage of the alternator 3 that is obtained from an increment or decrement by one unit degree of the output voltage relative to the old target value according to the information contained in the alternator control signal. Further, the excitation current control circuit 28 outputs a driving signal to the driver 30 in order to adjust the output voltage of the alternator 3 to the new target value of the output voltage of the alternator 3. In contrast to the case where the excitation current control circuit 28 sets a new target value of the output voltage of the alternator 3 according to the information contained in the alternator control signal, it is applicable that a specific circuit for setting the new target value of the output voltage is provided between the first alternator control signal storing circuit 26 and the excitation current control circuit 28. It is further applicable that the microcomputer 64 sets the new target value of the output voltage that is increased or decreased than the old target value by one unit degree of the output voltage, and the battery condition detecting apparatus 6 including the microcomputer 64 sends the alternator control signal to the electric power generation control unit 4 while the alternator control signal contains information about the new target value of the output voltage set by the microcomputer 64.

Further, the operating procedure in which discharging current is kept constant by controlling an output electric current of the alternator 3, as shown in FIG. 6, will be carried out as seen in the followings.

The electric power generation control unit 4 outputs the alternator condition signal to the microcomputer 64. The alternator condition signal includes information about the rotation speed of the alternator 3, the output voltage, and the excitation current, which are detected by the rotation speed detecting circuit 14, the output voltage detecting circuit 16, and the excitation current detecting circuit 18, respectively. The microcomputer 64 calculates the output current of the alternator 3 based on the information contained in the alternator condition signal, as at Step 210 in FIG. 6. The output current of the alternator 3 correlates with the rotation speed and the excitation current of the alternator 3. Hence it is possible to calculate the output current of the alternator 3 based on the information contained in the alternator condition signal, for example, the rotation speed and the excitation current of the alternator 3. In more detail, a predetermined relation between parameters such as the rotation speed and the excitation current of the alternator 3 is stored in a memory which is not shown in FIG. 7, and used to obtain the output voltage of the alternator 3 corresponding to some parameter value. Further, the output voltage of the alternator 3 is influenced by environmental temperature or the like. Thus, it is preferable that these additional parameters, such as the environmental temperature are detected and taken into consideration in a relationship between the parameters and the excitation current of the alternator 3. Hence it is possible to improve an accuracy of calculation of the output current of the alternator 3.

Next, the microcomputer 64 calculates a target value of the output current, as at Step 211 in FIG. 6. Further, the microcomputer 64 sends the alternator control signal to the electric power generation control unit 4, wherein the alternator control signal includes information useful to adjust the excitation current such that an actual output current of the alternator 3 agrees with the target value of the output current calculated by the microcomputer 64, as at Step 212 in FIG. 6. In order to adjust the excitation current, it is necessary to calculate a target value of the excitation current. However, this calculation can be carried out in the same manner in which the alternator control unit 606 calculates an output current of the alternator 3 as at Step 210 in FIG. 6. For example, when the relation between parameters including the alternator 3 and the excitation current and the output current is used, at first the excitation current that corresponds to both the rotation speed and the target value of the output current is obtained. This excitation current is considered as the target value of the excitation current in adjusting the excitation current. The excitation current control circuit 28 of the electric power generation control unit 4 generates a driving signal containing information about the target value of the excitation current in responsive to the alternator control signal sent from the battery condition detecting apparatus 6 to drive the power transistor 10. The driving signal is designed so as to adjust the excitation current of the alternator 3 to the target value of the excitation current. In contrast to the above mentioned embodiment in which the target value of the excitation current is obtained based on the target value of the output current, it is applicable that the target value of the excitation current is obtained by the electric power generation control unit 4. That is, a transforming circuit that obtains the target value of the excitation current based on the target value of the output current is provided between the first alternator control signal storing circuit 26 and the excitation current control circuit 28.

Figure 8:
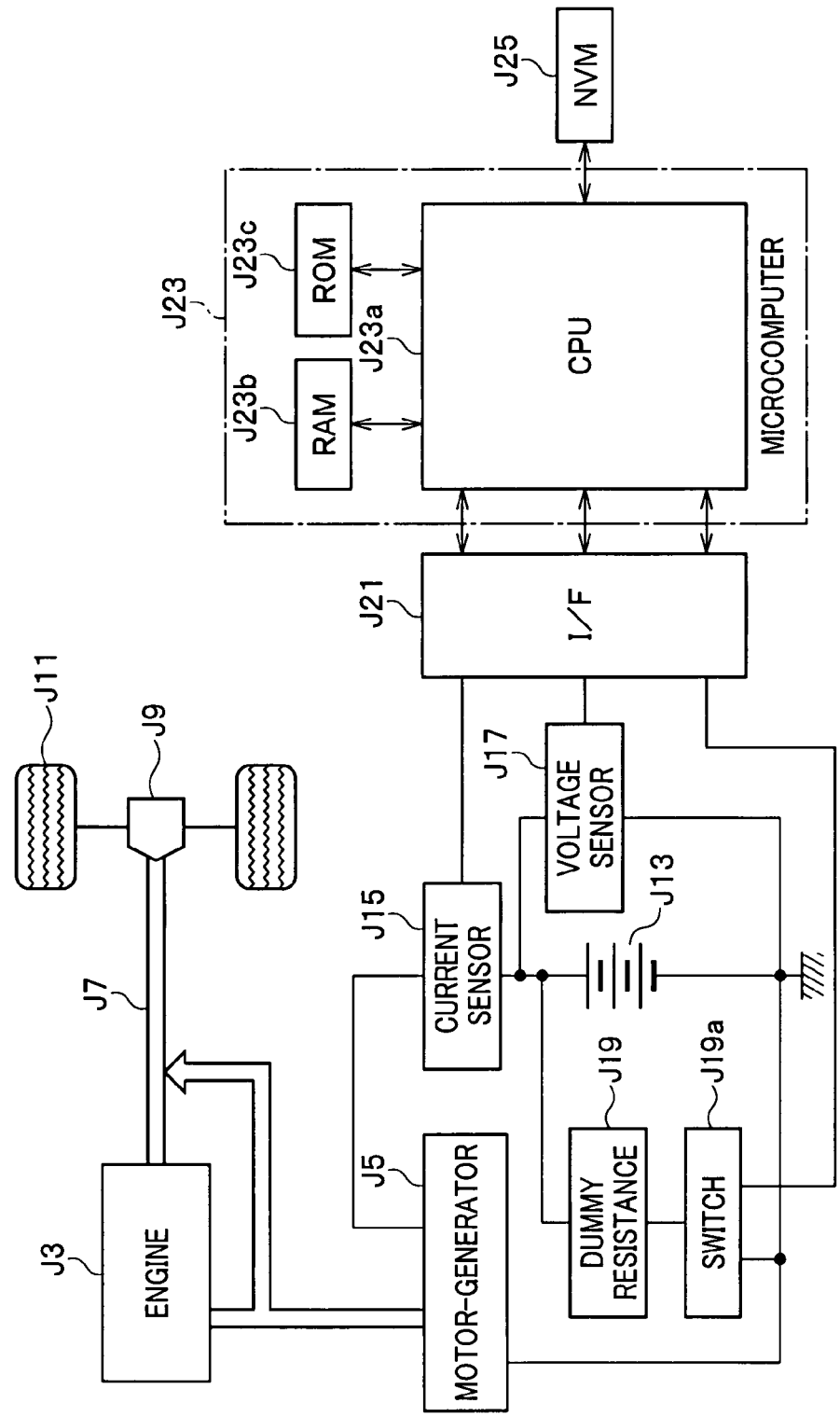
FIG. 8 is an illustration showing a general configuration of a known prior art of a battery condition detecting apparatus.

FIG. 8 is an illustration showing a general configuration of a known prior art of a battery condition detecting apparatus disclosed in the Japanese Patent Laid-Open No. 2002-184469. The battery condition detecting apparatus disclosed in the Japanese Patent Laid-Open No. 2002-184469 is suitable to be mounted in a hybrid vehicle having a motor generator J5 in addition to an engine J3.

As shown in FIG. 8, the hybrid vehicle normally moves by transferring an output of the engine J3 to wheels J11 via a shaft J7 and a differential gear J9. In a high load state of the vehicle, the motor generator J5 is activated to act as a motor by electric power supplied from a battery J13.

The known prior art of the battery condition detecting apparatus has a current sensor J15 and a voltage sensor J17. The current sensor is used for sensing a discharging current supplied from the battery 313 to electrical equipment including the motor generator J5 and a charging current supplied from the motor generator J5 to the battery J13. Furthermore, the battery condition detecting apparatus shown in FIG. 8 includes a microcomputer 323 and a non-volatile memory (NVM) J25. The microcomputer J23 receives outputs of the current sensor 315 and the voltage sensor J17 via an interface circuit (I/F) 321 after an analogue-digital (A/D) conversion of the outputs. The microcomputer 323 has a central processing unit (CPU) J23a, a random read memory (RAM) J23b, and a read only memory (ROM) J23c. It is important that the battery condition detecting apparatus shown in FIG. 8 further has a dummy resistance 319 and a switch J19a. The dummy resistance 319 is energized when a charge polarization of the battery J13 is being cancelled.

(Necessity of the Battery Condition Detecting Apparatus)

In recent years, a secondary battery (also referred to as simply a "battery") mounted on an automotive vehicle has used not only as an electric source for starting an internal combustion engine, that operates on-vehicle electric equipments, etc. but also as an electric source for driving an electromotive motor serving as a driving source of electric or hybrid vehicles. It is important to know a state of charge (hereinafter abbreviated to "SOC") of the battery.

It has been considered that there is an one-to-one correspondence between the SOC and an open circuit voltage of the battery. Hence, it is possible to calculate the SOC of the battery from the opening circuit voltage. However, because the opening circuit voltage is defined as a voltage obtained when a charge and discharge current of the battery is 0 amperes, that is, a voltage between open terminals when a polarization effect inside the battery is neglected. Thus, the open circuit voltage does not necessarily match the voltage of the battery due to the polarization effect inside the battery, if the voltage of the battery is detected by a voltage sensor. The battery voltage that is detected by the voltage sensor is generally a sum of the opening circuit voltage, a voltage drop due to internal resistance of the battery (usually this has a negative value), and a polarization voltage generated by the polarization effect (this is able to have both a positive and negative values), as shown in FIG. 10.

The voltage drop depends on the charge and discharge current and is 0 volts when the terminals are open.

The polarization voltage depends on factors such as charging or discharging conditions, an amount of current, and temperatures. If the terminals of the battery are left open, the polarization voltage decrease over time until the polarization voltage finally becomes to 0 volts after a sufficient time has passed.

During charging the battery, the polarization voltage increases in the positive direction. Hereinafter, when the polarization voltage becomes positive, a polarization generated during charging the battery will also be referred to as "charge polarization". By contrast, during discharging the battery, the polarization voltage increases in the negative direction. When the polarization voltage becomes negative, a polarization generated during discharging the battery is also be referred as to "discharge polarization".

As described above, in order to obtain the SOC of the battery, it is necessary to obtain the open circuit voltage, and in order to obtain the open circuit voltage it is necessary to accurately estimate the polarization voltage. In particular, it is usual that a battery mounted in an electric vehicle is discharged and charged many times during traveling. When the battery is rapidly charged by, for example, a regenerative breaking operation, the charge polarization occurs. It is thus difficult to determine the SOC of the battery based only on its internal resistance, if as long as the internal resistance of the battery is obtained. Hence it is required to monitor the charge polarization for correctly determining the SOC of the battery.

When it is hard to estimate the value of the polarization voltage, it is important to know whether or not the charge polarization is cancelled.

Operations and Primary Advantages of the Embodiment

As mentioned above, in the battery condition detecting apparatus according to the present invention, the discharging current is kept to be constant, that is a necessary condition for cancelling the charge polarization of the battery 5, by controlling the alternator 3 to adjust an amount of electric power generated thereby.

Therefore, according to the present invention, there is provided the battery condition detecting apparatus that does not need any redundant electric load so as to prevent to keep an unnecessary space in a vehicle, especially in an engine compartment, that does not consume any additional electric power, and that detects a cancellation of a charge polarization of the battery accurately.

Further, according to the present invention, there is provided the battery condition detecting apparatus in which long electric leads between sensors, such as a current sensor that senses electric currents and a voltage sensor that senses an electric potential, and the battery condition detecting apparatus are not needed. Therefore, it is possible to detects a cancellation of a charge polarization of the battery accurately since electrical noise generated in the engine compartment is not easily superimposed on electric signals flowing in the electric leads.

While the present invention has been disclosed in terms of the preferred embodiment in order to facilitate a better understanding thereof, it should be appreciated that the invention can be embodied in various ways without departing from the principle of the invention. For example, in the operating procedure shown in FIG. 6, the discharging current is kept to be constant under a control in which the target value of the output current of the alternator 3 is obtained by adding a difference between an actual discharging current of the battery 5 detected by the discharging and charging current detecting unit 600 and the target value to the calculated target value of the output current of the alternator 3. However, the calculated target value of the output current of the alternator 3 does not take into consideration the effect of the environmental temperature on the output current. Therefore, it is preferable that the effect of the environmental temperature on the output current is removed by comparing the target value of the output current and the actual value of the output current detected by the discharging and charging current detecting unit 600. For example, an output current sensor is provided near an output terminal of the alternator 3. The output current sensor constitutes means for detecting an output current of the alternator 3. The detected value of the output current is sent from the electric power generation control unit 4 to the battery condition detecting apparatus 6. If the configuration shown in FIG. 6 is adopted, the detected value of the output current can be included in the battery condition signal. In the alternator control unit 606, a difference between the calculated value of the output current and the detected value of the output current is obtained. Then, a calculation of the target value of the output current is carried out, as at Step 211 in FIG. 7, with taking into consideration of the difference. For example, if the calculated value of the output current is greater than the detected one, the difference should be subtracted from the calculated value of the output current that is obtained with neglecting the effect of the environmental temperature on the output current. In contrast to this, if the calculated value of the output current is not greater than the detected one, the difference should be added to the calculated value of the output current that is obtained with neglecting the effect of the environmental temperature on the output current.

What is claimed is:

1. An apparatus for detecting a condition of a battery, the apparatus comprising:
   means for detecting discharging and charging current of the battery;
   means for detecting whether or not a negative acceleration of the charging current of the battery changes in sign from negative to zero during charging of the battery based on the charging current detected by the discharging and charging current detecting means;
   means for calculating an integrated charged capacity of the battery by integrating the charging current of the battery until the negative acceleration of the charging current changes in its sign from negative to zero during the charging of the battery;
   means for controlling output electric power of an alternator, which is electrically connected to charge the battery so as to keep the discharging current of the battery constant during discharging of the battery that occurs following the charging of the battery; and
   means for determining, when an integrated discharged capacity of the battery becomes equal to the integrated charged capacity, that charge polarization of the battery generated during the charging of the battery is cancelled.

2. The apparatus according to claim 1, wherein
   the alternator has means for controlling the alternator so as to set a terminal voltage of the battery to be equal to a target output voltage of the alternator, and
   the means for controlling the alternator compares the discharging current detected by the discharging a charging current detecting means with a target value of the discharging current of the battery, and adjusts the target output voltage of the alternator based on a result of the comparison.

3. The apparatus according to claim 1, wherein
   the means for controlling the alternator further comprising:
   means for calculating an output current of the alternator; and
   means for controlling the alternator to adjust the output current of the alternator based on the output current of the alternator calculated by the means for calculating the output current of the alternator such that the detected value of the discharging current becomes to agree with the target value of the discharging current.

4. The apparatus according to claim 3, further comprising:
   means for detecting the output current of the alternator,
   wherein the means for controlling the alternator to adjust the output current of the alternator corrects the output current of the alternator based on the detected value of the output current of the alternator detected by the means for detecting the output current of the alternator.

5. The apparatus according to claim 1, wherein
   the discharging and charging current detecting means, the means for detecting whether or not the negative acceleration of the charging current changes in its sign from negative to zero, the means for calculating the integrated charged capacity of the battery, the means for controlling the alternator, and the means for determining that the charge polarization of the battery generated during charging of the battery is cancelled, are arranged near a terminal of the battery.

6. The apparatus according to claim 5, wherein
   the discharging and charging current detecting means is constituted by an electric current sensor fixed to the terminals of the battery or the housing of the battery, and
   the electric sensor has built therein all of the discharging and charging current detecting means, the means for detecting whether or not the negative acceleration of the charging current changes in its sign from negative to zero, the means for calculating the integrated charged capacity of the battery, the means for controlling the alternator, and the means for determining that the charge polarization of the battery generated during charging of the battery is cancelled.

* * * * *